United States Patent
Scheucher

(10) Patent No.: US 8,264,092 B2
(45) Date of Patent: Sep. 11, 2012

(54) INTEGRATED CIRCUITS ON A WAFER AND METHOD OF PRODUCING INTEGRATED CIRCUITS

(75) Inventor: Heimo Scheucher, Langegg (AT)

(73) Assignee: NXP B.V., Eindhoven (NL)

( * ) Notice: Subject to any disclaimer, the term of this patent is extended or adjusted under 35 U.S.C. 154(b) by 303 days.

(21) Appl. No.: 12/668,488

(22) PCT Filed: Jul. 10, 2008

(86) PCT No.: PCT/IB2008/052781
§ 371 (c)(1),
(2), (4) Date: Jan. 11, 2010

(87) PCT Pub. No.: WO2009/007932
PCT Pub. Date: Jan. 15, 2009

(65) Prior Publication Data
US 2010/0155967 A1    Jun. 24, 2010

(30) Foreign Application Priority Data
Jul. 12, 2007 (EP) .................................. 07112362

(51) Int. Cl.
*H01L 23/544* (2006.01)
*H01L 21/68* (2006.01)

(52) U.S. Cl. ......... 257/797; 257/E21.599; 257/E21.525; 257/E23.179; 257/685; 257/723; 257/777; 257/774; 257/773; 257/620; 438/17; 438/462; 438/106; 438/110; 438/114

(58) Field of Classification Search .................. 257/797, 257/E21.599, E23.179, E21.525, 685, 723, 257/777, 774, 773, 620; 438/17, 462, 106, 438/110, 114
See application file for complete search history.

(56) References Cited

U.S. PATENT DOCUMENTS

| | | | |
|---|---|---|---|
| 5,384,952 A * | 1/1995 | Matsui | 29/840 |
| 5,726,502 A | 3/1998 | Beddingfield | |
| 6,338,980 B1 * | 1/2002 | Satoh | 438/106 |
| 6,448,783 B1 * | 9/2002 | Fukuda | 324/537 |
| 2005/0023706 A1 | 2/2005 | Furuya et al. | |
| 2006/0219943 A1 | 10/2006 | Jean-Louis | |
| 2007/0040245 A1 * | 2/2007 | Seno et al. | 257/666 |
| 2007/0164432 A1 | 7/2007 | Wakisaka | |
| 2010/0140748 A1 * | 6/2010 | Scheucher | 257/620 |
| 2010/0181568 A1 * | 7/2010 | Scheucher et al. | 257/48 |

FOREIGN PATENT DOCUMENTS

| | | |
|---|---|---|
| DE | 102 19 346 A1 | 11/2003 |
| JP | 2004 349611 A | 12/2004 |

* cited by examiner

*Primary Examiner* — A O Williams

(57) ABSTRACT

Integrated circuits (Ia, Ib) on a wafer (2) comprise first and second integrated circuits (Ia, Ib) which each include an electric circuit (3). Only the first integrated circuits (Ia) comprise each at least one bump (8) not contacting their relevant electric circuits (3).

13 Claims, 5 Drawing Sheets

INTEGRATED CIRCUITS ON A WAFER AND METHOD OF PRODUCING INTEGRATED CIRCUITS

FIELD OF THE INVENTION

The invention relates to integrated circuits on a wafer and to a method of producing integrated circuits.

BACKGROUND OF THE INVENTION

Integrated circuits are usually produced by forming a plurality of integrated circuits on a semiconductor wafers. The individual integrated circuits are separated by saw or scribe lines. The finished integrated circuits are electrically tested while still being on the wafer, registered as working and non-working integrated circuits, and then separated into individual integrated circuits by sawing the wafer along the saw lines or utilizing a scribe method. The separated integrated circuits are normally placed on a film frame carrier in an order corresponding to the order when being on the wafer. Due to the registration in working and non-working integrated circuits, a pick-and-place system can pick up the working integrated circuits for further processing.

Particularly, if the saw lines are relatively narrow, virtually zero when utilizing laser-dicing, or almost zero when utilizing trench etching, then the foil of the film frame carrier has to be stretched to generate appropriate gaps between the individual integrated circuits such that the pick-and-place system can pick up the working integrated circuits. Tolerances of the gaps may result in a misaligned pick-and-place system in respect to the integrated circuits on the film frame carrier, potentially preventing the pick-and-place system to reliably picking up the appropriate integrated circuits. This may even be more pronounced if the integrated circuits are relatively small.

OBJECT AND SUMMARY OF THE INVENTION

It is an object of the present invention to provide integrated circuits which allow a pick-and-place system picking up separated integrated circuits to work more reliably.

Another object of the present invention is to provide a method for producing integrated circuits allowing the pick-and-place system to work more reliably.

The object is achieved in accordance with the invention by means of integrated circuits on a wafer, comprising first and second integrated circuits which each include an electric circuit, wherein only the first integrated circuits comprise each at least one bump not intended for contacting their relevant electric circuits.

The object is also achieved in accordance with the invention by means of a method for producing integrated circuits, comprising the steps of:
  providing a plurality of integrated circuits on a wafer separated by saw lines, the integrated circuits on the wafer comprising first and second integrated circuits which each include an electric circuit, wherein only the first integrated circuits comprise each at least one alignment bump used as alignment marks and not contacting their relevant electric circuits, and the integrated circuits on the wafer having being tested and registered as working and non-working integrated circuits;
  separating the integrated circuits on the wafer; the separated integrated circuits being placed on a film frame carrier; and
  automatically picking up the working integrated circuits from the film frame carrier utilizing a pick-and-place system which is aligned utilizing the alignment bumps of the first integrated circuits.

The pick-and-place system may particularly be aligned during the picking up or before the picking-up of the working integrated circuits utilizing the alignment bumps of the first integrated circuits.

As described in the introduction, integrated circuits are produced on a semiconductor wafer. Before separating the individual integrated circuits, the electric properties of their electric circuits are tested and the integrated circuits are registered as working and non-working integrated circuit. Normally, integrated circuits comprise contact bumps via which the electric circuits are contacted when connecting the finished integrated circuits to further electric devices.

The inventive integrated circuits on the wafer comprise two different groups of integrated circuits, namely the first and second integrated circuits. The first and second integrated circuits differ in such that only the first integrated circuits each comprise the at least one bump not intended for contacting the relevant electric circuit, i.e. the first integrated circuits comprise, in addition to contact bumps provided for contacting the relevant electric circuit, the bumps not meant to contact the relevant electric circuit. Thus, the additional bumps of the first integrated circuits do not electrically contact the electric circuit.

The additional bumps of the first integrated circuits are particularly optical alignment bumps provided as alignment marks for a pick-and-place system utilized for picking-up the separated integrated circuits.

Usually, the integrated circuits are arranged in grid or matrix-form on the wafer and are separated by saw lines which are also referred to as scribe lines. Then, the integrated circuits on the wafer are separated from each other by first saw lines running parallel in a first direction and by second saw lines running parallel in a second direction which is perpendicular to the first direction. Then, there may be the same number of second integrated circuits between two first integrated circuits located on the wafer in respect to the first and/or second direction. For instance, every $5^{th}$, $10^{th}$, $20^{th}$, $25^{th}$, etc. integrated circuit in each of the two directions may be a first integrated circuit, i.e. includes an alignment bump, and the remaining integrated circuits are second integrated circuits and do not include alignment bumps. The alignment bumps may also be placed on top of test element groups (TEGs), such as process control or optical process modules (PCM/OCM) PCM/OCM, mask alignment markers, or laser alignment markers in the reticle field. This may alleviate problems during quality inspections, because the first and second integrated circuit differ by the additional alignment bumps. Optionally, master alignment marker and several slave alignment marker for a defined pick and place start reference for the pick-and-place system may be included.

Before separating the integrated circuits on the wafer into individual integrated circuits, the electric properties of the electric circuits are usually tested and the integrated circuits are registered as working and as non-working integrated circuits. The registration in working and non-working integrated circuits may be performed utilizing an electronic map corresponding to the matrix-arrangement of the integrated circuits on the wafer, wherein working integrated circuits may be labeled accordingly within the electronic map. For instance, working integrated circuits may be labeled by "1" and non-working integrated circuits may be labeled as "0".

After testing the electric properties of the electric circuits, the integrated circuits on the wafer are normally separated.

The separating may, for instance, be performed utilizing an appropriate saw or laser. When utilizing the saw, the integrated circuits may be separated by sawing along the saw lines. When utilizing the laser, then the laser may be guided along the saw lines producing scribes in the saw lines or altering the semiconductor material at the saw lines. Then, the integrated circuits are not yet separated and are attached to a foil of a film frame carrier. Then, the foil including the integrated circuits are broken by, for instance, breaking the saw lines by appropriately flexing the wafer. The separation may also be preformed utilizing deep trench etching technology with very small deep trenches.

The separated working integrated circuits are then removed from the film frame carrier by means of an appropriate pick-and-place system. Such pick-and-place systems may individually remove the working integrated circuits based on the electronic map.

Especially when utilizing laser-dicing, then the separated integrated circuits are relatively close together on the film frame carrier. Then, the foil of the film frame carrier may be stretched in order to generate appropriate gaps between adjacent integrated circuits needed for the pick-and-place system. The pick-and-place system is controlled in accordance with the registered working and non-working integrated circuits utilizing, for instance, the aforementioned electronic map. Due to tolerances of the generated gaps, the pick-and-place system may pick wrong integrated circuits. This is even more pronounces, when the individual integrated circuits are relatively small.

The inventive integrated circuits, however, comprise the first and second integrated circuits of which the first integrated circuits comprise the alignment bumps. The alignment bumps can be used to align the pick-and-place place system before or during the picking up of the individual working integrated circuits from the film frame carrier. The alignment bumps can, for instance, be detected by a sensor of the pick-and-place system which, in response to detected alignment bumps, can automatically be adjusted to pick up the desired integrated circuits. For instance, if every $10^{th}$ integrated circuit on the wafer in respect to the first and second directions of the saw lines is one of the first integrated circuits and the remaining integrated circuits are second integrated circuits, then every $10^{th}$ integrated circuit in respect to the two directions comprises an alignment bump and the remaining integrated circuits do not include such an alignment bump. Then, if the pick-and-place system has to pick up an individual integrated circuit, it can detect if the relevant integrated circuit comprises an alignment bump and can, if necessary, align itself automatically.

In one embodiment of the inventive integrated circuits, each integrated circuit may comprise a passivation layer. Then, the bumps of the first integrated circuits may be attached on the relevant passivation layer. This assures that the alignment bumps do not contact the electric circuits of the integrated circuits.

It may also be useful that the alignment bumps of the first integrated circuits protrude through the relevant passivation layers without contacting the relevant electric circuits.

The alignment bumps may particularly be made from the same material as the contact bumps of the integrated circuits. A useful material for the alignment bumps is, for instance, metal and particularly gold. The bumps may be applied on top of an under-bump metallization made, for instance, from Al, AlCu, or TiW. Alignment bumps made from metal can relatively easily be provided on the passivation layer and alignment bumps made from gold can be detected relatively easily utilizing optical sensors.

The alignment bumps can have arbitrary forms. They may especially have the form of at least one symbol, at least one number, at least one letter, at least one rectangular, at least one line, and/or a bar code.

Alternatively or additionally, the alignment bumps can be used as optical alignment marks for a stepper when producing the integrated circuits on the wafer. This stepper can, for instance, be used for electrically testing the integrated circuits on the wafer.

BRIEF DESCRIPTION OF THE DRAWINGS

The invention will be described in greater detail hereinafter, by way of non-limiting examples, with reference to the embodiments shown in the drawings.

DESCRIPTION OF EMBODIMENTS

Figure 1:
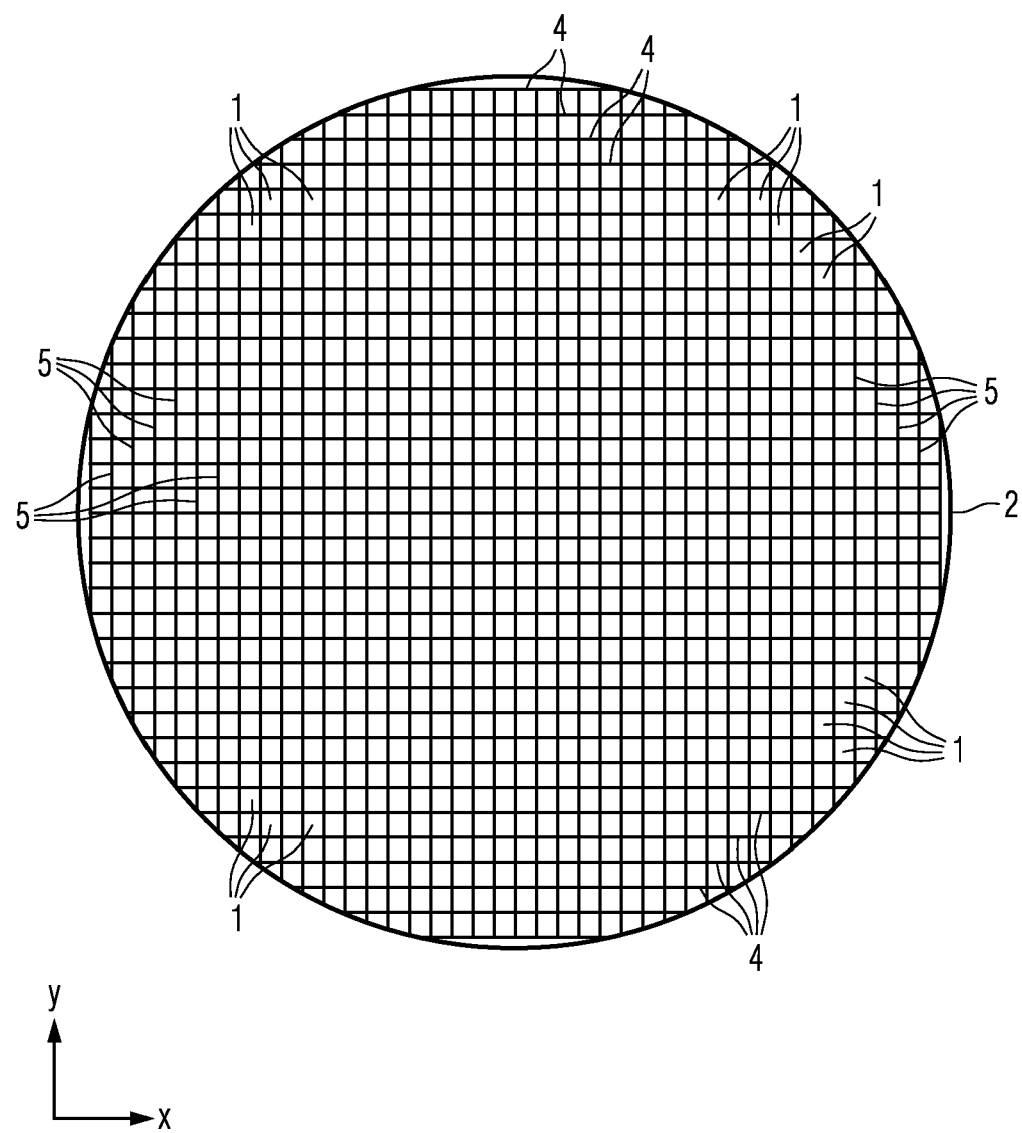
FIG. 1 is a top-view of a plurality of integrated circuits on a wafer.
Figure 2:
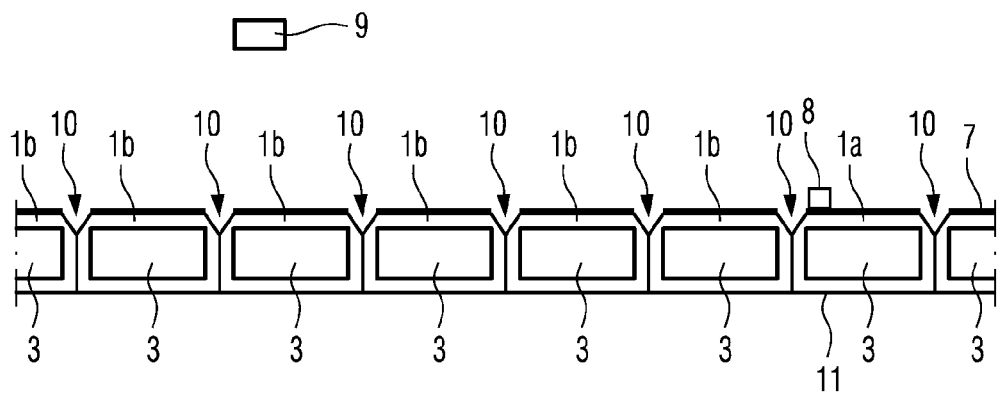
FIG. 2 is a cross section of the wafer.

FIG. 1 shows a top-view of a plurality of integrated circuits 1 on a semiconductor wafer 2 and FIG. 2 shows a cross section of the wafer 2. The integrated circuits 1 have been formed on the wafer 2 as it is generally known in the art. Each integrated circuit 1 comprises an electric circuit 3. For the exemplary embodiment, the integrated circuits 1 have an area of approximately 405 µm×405 µm.

The integrated circuits 1 on the wafer 2 are separated by first saw lines 4 running parallel in a first direction x and by second saw lines 5 running parallel in a second direction y. The two directions x, y are orthogonal to each other. For the exemplary embodiment, the saw lines 4, 5 are approximately 15 µm thin or even thinner than 15 µm.

Figure 3:
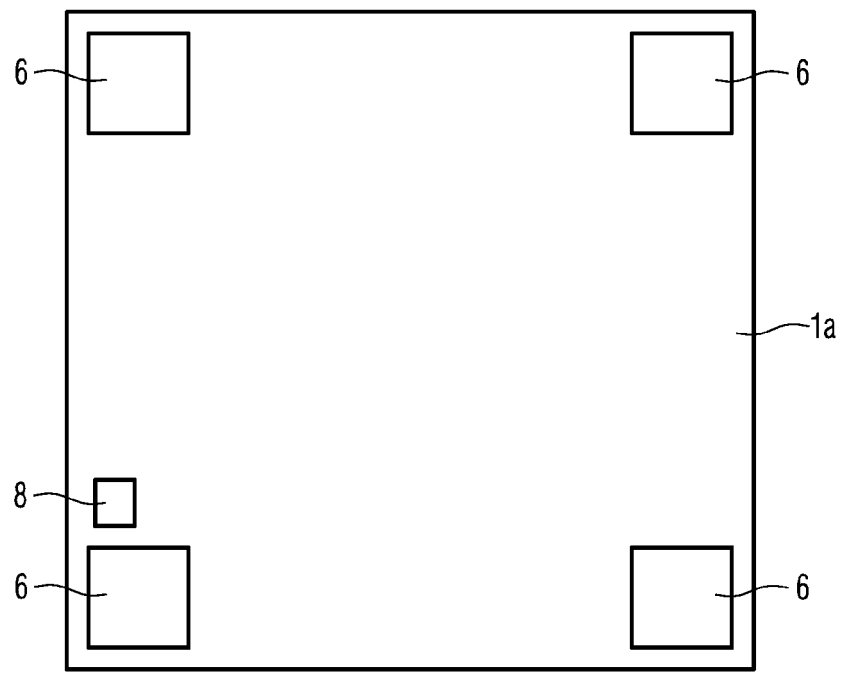
FIG. 3 is a top view of a first type of integrated circuits on the wafer.
Figure 4:
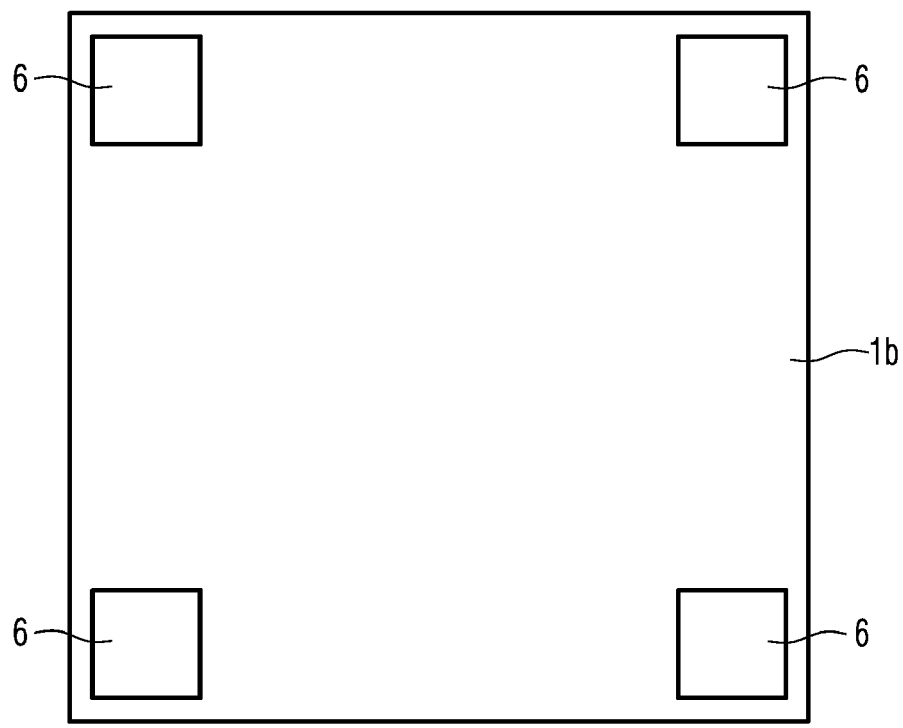
FIG. 4 is a top view of a second type of integrated circuits on the wafer.

The integrated circuits 1 are comprised of two different types of integrated circuits, namely first integrated circuits 1a and second integrated circuits 1b. A top-view of one of the first integrated circuits 1a is shown in FIG. 3 and a top view of one of the second integrated circuits 1b is shown in FIG. 4.

For the exemplary embodiment, each of the first and second integrated circuits 1a, 1b is covered by a passivation layer 7. A passivation layer is a sealing layer added, for instance, at the end of the fabrication process of the integrated circuits 1 on the wafer 2 to prevent deterioration particularly of electrical properties of the electric circuits 3 of the integrated circuits 1. The passivation layer 7 may comprise silicon dioxide or silicone nitride and may also protect the electric circuits 3 against moisture or contamination.

Each integrated circuit 1 further comprises four contact bumps 6 which may be located at the corners of the respective integrated circuits 1 and have an area of approximately 60 µm×60 µm for the exemplary embodiment. The contact bumps 6 are made from metal, for instance, gold and are connected electrically to the electric circuit 3 of the relevant integrated circuit 1. The contact bumps 6 are intended to connect a finished integrated circuit 1 to further electrical devices.

In contrast to the second integrated circuits 1b, the first integrated circuits 1a comprise each at least one additional bump 8 which does not contact the electric circuit 3 of the relevant first integrated circuit 1a. For the exemplary embodiment, each first circuit 1a comprises one such bump 8 which is also made from the same material as the contact bumps 6.

The bumps 8 are optical alignment bumps used for a pick-and-place system described further below.

Figure 5:
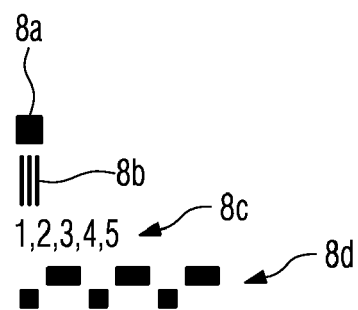
FIG. 5 is a bump of an integrated circuit of the first type.

For the exemplary embodiment, the alignment bumps 8 have an area of approximately 15 μm×15 μm. FIG. 5 shows examples of suitable alignment bumps 8. The alignment bumps 8 may, for instance, be a rectangular 8a, a bar code 8b, numbers 8c, or a plurality of symbols 8d.

For the exemplary embodiment, the alignment bumps 8 are attached on top of the passivation layers 7 of the first integrated circuits 1a as illustrated in FIG. 2. This is, however, not the only way to attach the alignment bumps 8 on the first integrated circuits 1a. They may, for instance, protrude through the passivation layer 7 without contacting the electric circuits 3.

Figure 6:
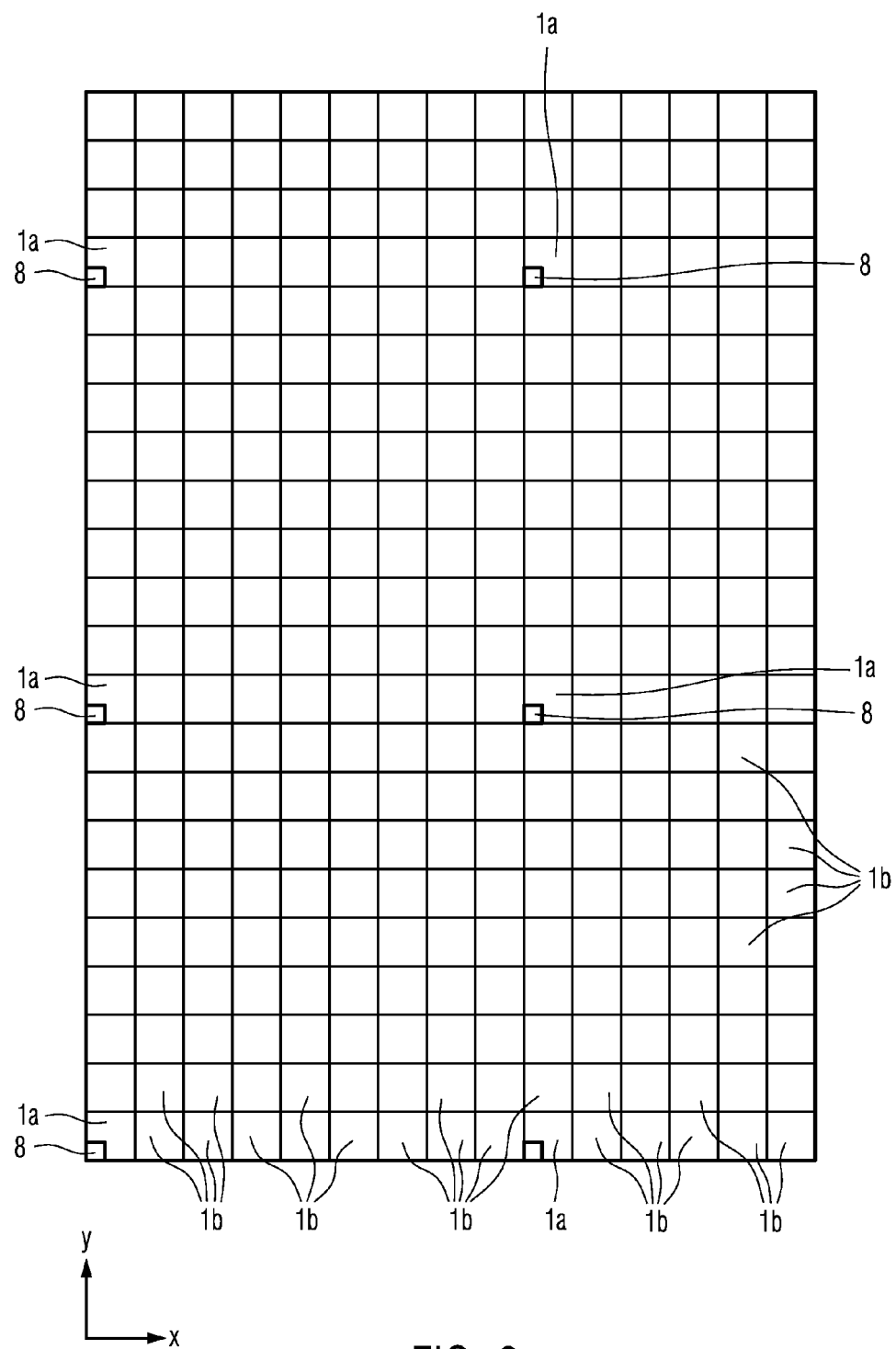
FIG. 6 is a matrix illustrating the arrangement of the integrated circuits on the wafer.

As discussed above, the integrated circuits 1 on the wafer 2 are comprised of first integrated circuits 1a and second integrated circuits 1b. For the exemplary embodiment, there are eight second integrated circuits 1b placed between two first integrated circuits 1a in each directions x, y. FIG. 6 shows a matrix illustrating the distribution of first and second integrated circuits 1a, 1b on the wafer 2.

After the last production step of the integrated circuits 1 on the wafer 2, which is providing the alignment marks 8 on the passivation layers 7 of the first integrated circuits 1a for the exemplary embodiment, the electric properties of the electric circuits 3 are tested using a well known testing system not explicitly shown in the figures. The testing system is controlled by a computer 15 which stores an information about the result of the testing. Particularly for the exemplary embodiment, the result of the testing may have the form of an electronic map 14 corresponding to the matrix of FIG. 6, wherein the electronic map 14 indicates working and non-working integrated circuits 1 on the wafer 2. For instance, working integrated circuits 1 may be marked on the electronic map by "1" and non-working integrated circuits 1 may be marked on the electronic map by "0".

After testing the integrated circuits 1 on the wafer 2 and recording the result of the testing, the integrated circuits 1 on the wafer 2 are separated into individual integrated circuits 1 during a separation step. For the exemplary embodiment, the separation step is carried out by guiding a laser 9 along the saw lines 4, 5. The laser 9 is shown in FIG. 2 and forms scribes 10 along the saw lines 4, 5. After producing the scribes 10, the integrated circuits 1 are still not separated and are attached with their bottom sides on a foil 11 of a film frame carrier 12 depicted in FIGS. 2, 7, and 8.

The foil 11 of the film frame carrier 12 is flexible, such that the wafer 2 can be flexed in order to separate the individual integrated circuits 1 by breaking the wafer 2 along the saw lines 4, 5. The wafer 2 may be flexed by utilizing bars as it is per se known in the art.

Figure 7:
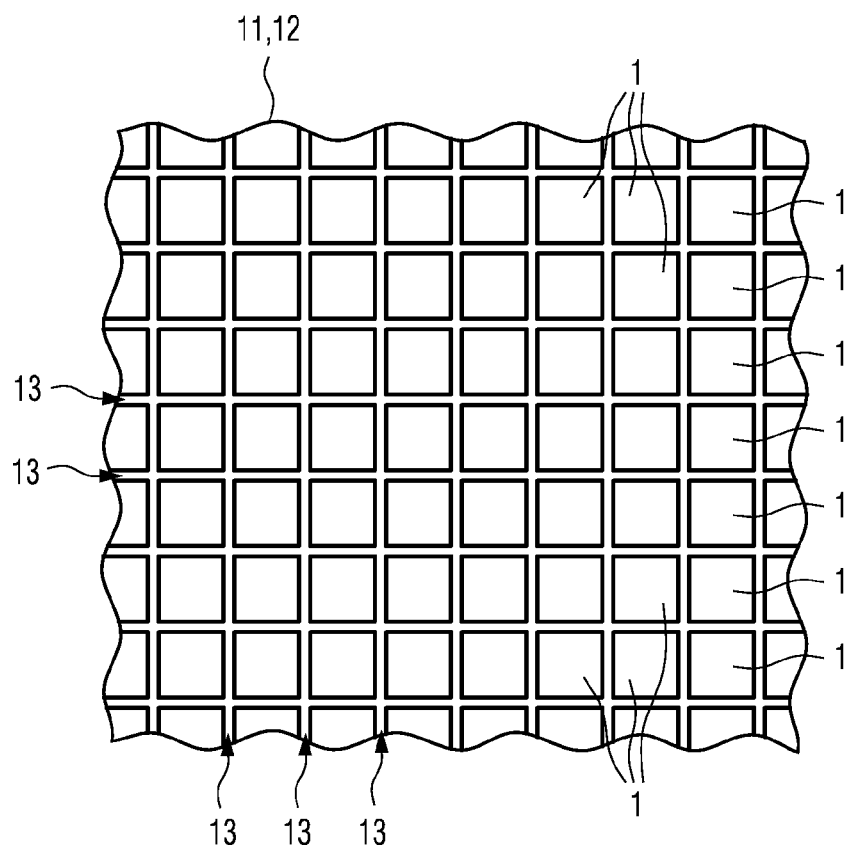
FIG. 7 is a top-view of separated integrated circuits on a film frame carrier.

After breaking the wafer 2 along the saw lines 4, 5, the foil 11 of the film frame carrier 12 is slightly stretched in order to generate gabs 13 between adjacent separated integrated circuits 1. FIG. 7 depicts a top-view and FIG. 8 a cross section of the separated integrated circuits 1 attached on the foil 11 of the film frame carrier 12. The gaps 13 are approximately 10 μm thin for the exemplary embodiment.

Figure 8:
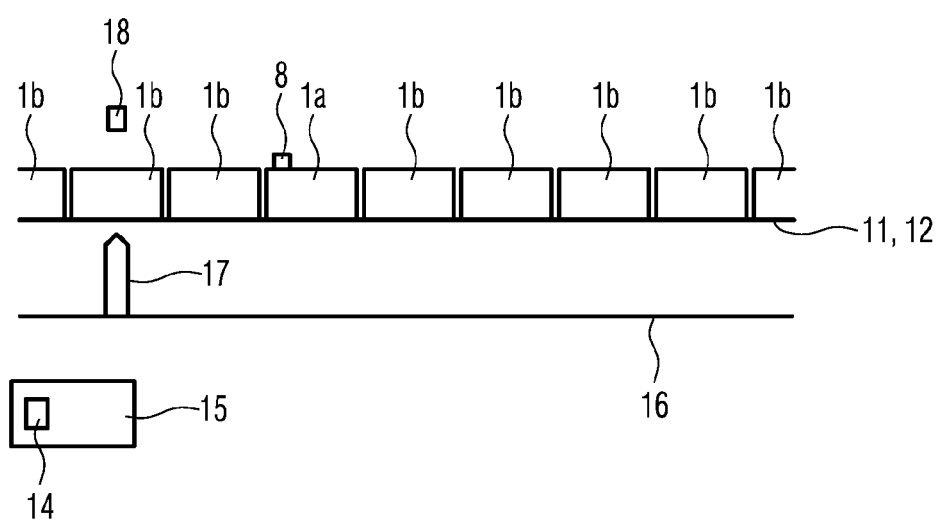
FIG. 8 is a cross section of the separated integrated circuits on the film frame carrier.

After that, the separated and working integrated circuits 1 are picked up from the film frame carrier 12 utilizing a pick-and-place system 16 shown in FIG. 8.

For the exemplary embodiment, the pick-and-place system 16 is controlled by the computer 15 utilizing the electronic map 14 which indicates which of the integrated circuits 1 are working and which of the integrated circuits 1 are non-working integrated circuits 1. The pick-and-place system 16 comprises a needle 17 which, during the picking up of the working integrated circuits 1, is moved under the relevant integrated circuit 1 and moved up in order to slightly lift the relevant integrated circuit 1. The pick-and-place system 16 further comprises an optical sensor 18 which detects the alignment marks 8 of the integrated circuits 1a. The optical sensor 18 may be mechanically coupled to the needle 17 such that the optical sensor 18 is above and the needle 17 is below an integrated circuit 1 to be picked up.

For the exemplary embodiment described above, each integrated circuit 1 comprises four contact bumps 6. This is not absolutely necessary. The integrated circuits 1 can also comprise more than four or less than four contact bumps 6. The contact bumps 6 do not necessarily need to be located at the corners as shown in the figures. There location can be chosen arbitrarily on the integrated circuits 1. The area of the contact bumps 6 can also be greater or less than 60 μm×60 μm. The area of the contact bumps 6 can particularly be less than 30 μm×30 μm. The mentioned area of the integrated circuits 1 is also only an example. Particularly, the area of the integrated circuits 1 can be in a range of less than 50 μm×50 μm to above 1 mm×1 mm.

For the exemplary embodiment, the alignment bumps 8 are attached on top of the passivation layers 7. They may also contact a metal area not contacted to the electric circuits 3 through an opening of the passivation layer 7. This variant may be beneficial, for instance, in case of utilizing flip chip connection for the separated integrated circuits 1, particularly, if the height of the alignment bumps 8 differ to much from the height of the contact bumps.

Finally, it should be noted that the aforementioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. Integrated circuits on a wafer, comprising a passivation layer and first and second integrated circuits which each include an electric circuit, wherein only the first integrated circuits comprise each at least one bump not contacting their electric circuits and extending from the passivation layer.

2. The integrated circuits of claim 1, wherein the bumps are alignment marks for a pick-and-place system utilized for picking-up the integrated circuits during separation from the wafer.

3. The integrated circuits of claim 1, wherein the bumps of the first integrated circuits are attached directly on the relevant passivation layers.

4. The integrated circuits of claim 1, wherein the bumps of the first integrated circuits protrude through the relevant passivation layers without contacting the electric circuits.

5. The integrated circuits of claim 1, wherein the bumps are made from metal, particularly from gold, and/or are applied on an under-bump metallization on top of a pad of the integrated circuits.

6. The integrated circuits of claim 1, wherein each bump has the form of at least one symbol, at least one number, at least one letter, at least one rectangular, at least one line and/or a bar code.

7. The integrated circuits of claim 1, wherein the integrated circuits on the wafer are separated from each other by first saw lines running parallel in a first direction and by second saw lines running parallel in a second direction which is perpendicular to the first direction, and wherein between two first integrated circuits in the first and/or second direction are the same number of second integrated located on the wafer.

8. A method for producing integrated circuits, comprising the steps of:
providing a plurality of integrated circuits on a wafer separated by saw lines, the integrated circuits on the wafer comprising a passivation layer and first and second integrated circuits which each include an electric circuit, wherein only the first integrated circuits comprise each at least one alignment bump extending from the passivation layer used as alignment marks and not contacting their electric circuits, and the integrated circuits on the wafer having being tested and registered as working and non-working integrated circuits;
separating the integrated circuits on the wafer; the separated integrated circuits being placed on a film frame carrier; and
automatically picking up the working integrated circuits from the film frame carrier utilizing a pick-and-place system which is aligned utilizing the alignment bumps of the first integrated circuits.

9. The method of claim 8, wherein the integrated circuits on the wafer are separated utilizing scribing, particularly utilizing a laser, or utilizing deep trench etching technology.

10. The method of claim 8, wherein each bump has the form of at least one symbol, at least one number, at least one letter, at least one rectangular, at least one line and/or a bar code.

11. An apparatus comprising:
a semiconductor wafer;
a plurality of integrated circuits arranged in an array on the wafer;
a passivation layer on the plurality of integrated circuits;
for each integrated circuit, at least one contact bump extending above the passivation layer and contacting the integrated circuit; and
an array of alignment bumps extending above the passivation layer, each of the alignment bumps being
on a portion of the passivation layer over one of the integrated circuits,
electrically isolated from the integrated circuits by the passivation layer,
separated from the at least one contact bump that contacts the integrated circuit over which the alignment bump is located, and
separated from other ones of the alignment bumps by a common number of the integrated circuits.

12. The apparatus of claim 11, wherein the semiconductor wafer is scribed between each of the integrated circuits, further including a foil connected to the semiconductor wafer and configured and arranged to stretch and separate the integrated circuits from one another while maintaining the integrated circuits in an array and separated by about equal distances.

13. The apparatus of claim 11, wherein the array of alignment bumps includes, for each integrated circuit over which an alignment bump is formed, a plurality of alignment bumps in a pattern on the passivation layer.

* * * * *